United States Patent [19]
Toda

[11] Patent Number: 5,565,726
[45] Date of Patent: Oct. 15, 1996

[54] ULTRASONIC VIBRATING ACTUATOR

[76] Inventor: Kohji Toda, 1-49-18 Futaba, Yokosuka 239, Japan

[21] Appl. No.: 421,513

[22] Filed: Apr. 13, 1995

[51] Int. Cl.⁶ .................................................. H01L 41/08
[52] U.S. Cl. .......................................................... 310/323
[58] Field of Search .................................. 310/323, 328, 310/369

[56] References Cited

U.S. PATENT DOCUMENTS

| | | | |
|---|---|---|---|
| 4,019,073 | 4/1977 | Vishnevsky et al. | 310/323 |
| 4,453,103 | 6/1984 | Vishnevsky et al. | 310/323 |
| 4,742,260 | 5/1988 | Shimizu et al. | 310/323 |
| 4,868,446 | 9/1989 | Kumada | 310/323 |
| 5,237,238 | 8/1993 | Berghaus et al. | 310/328 |

*Primary Examiner*—Mark O. Budd

[57] ABSTRACT

An ultrasonic vibrating unit comprising a piezoelectric vibrator, at least a pair of electrodes D and G, electrode terminals $T_D$ and $T_G$ formed on the electrodes D and G, respectively, a vibrating plate connected to the piezoelectric vibrator, and at least one bar. The piezoelectric vibrator having two end surfaces running perpendicular to the thickness direction thereof has a pillar-shaped body with a pierced hole located parallel to the thickness direction. The pair of electrodes D and G are formed on the two end surfaces, respectively. The bar is fixed to the vibrating plate such that one tip of the bar is in contact with one end surface of the vibrating plate or penetrates from one end surface to the other end surface thereof. When an electric signal with a frequency substantially equal to one of the resonance frequencies of the piezoelectric vibrator is applied to the piezoelectric vibrator through the electrode terminals $T_D$ and $T_G$, the piezoelectric vibrator is vibrated acoustically. The acoustic vibration is transmitted to the vibrating plate through the first surface portion of the vibrating plate. The bar receives the acoustic vibration from the vibrating plate. A large vibration displacement is caused on surface of the bar. An ultrasonic vibrating actuator is made of the ultrasonic vibrating unit and at least a moving element which is in contact with surface of the bar. When operating the ultrasonic vibrating actuator, the moving element can be made to move by the vibration displacement caused on side surface of the bar.

26 Claims, 18 Drawing Sheets

— 1 —

ULTRASONIC VIBRATING ACTUATOR

BACKGROUND OF THE INVENTION

1. Field of the Invention.

The present invention relates to an ultrasonic vibrating unit and an ultrasonic vibrating actuator using an ultrasonic vibrating unit as an electromechanical conversion means.

2. Description of the Prior Art. Conventional ultrasonic motors include a mode rotation-type device, a standing wave-type device, which is based upon the standing wave, and a multi resonance-type device. These conventional ultrasonic motors have a moving element and a vibrator, the moving element receiving the acoustic vibration generated with the vibrator and moving along a single direction. These conventional ultrasonic motors are complex in both mechanical and circuit structure with respect to the driving circuit for the vibrator. These conventional ultrasonic motors have the disadvantage of transmitting weak or no acoustic vibration to the moving element when the distance between the moving element and the vibrator is long. In addition, it is difficult to miniaturize and to improve the power consumption efficiency of these techniques.

SUMMARY OF THE INVENTION

An object of the present invention is to provide an ultrasonic vibrating unit and an ultrasonic vibrating actuator capable of stable output characteristics over a long time.

Another object of the present invention is to provide an ultrasonic vibrating unit and an ultrasonic vibrating actuator capable of causing a large vibration displacement under low voltage operation with low power consumption.

A still other object of the present invention is to provide an ultrasonic vibrating unit and an ultrasonic vibrating actuator capable of controlling the magnitude and the direction of the vibration displacement.

A still further object of the present invention is to provide an ultrasonic vibrating unit and an ultrasonic vibrating actuator having a small size with a simple structure.

According to one aspect of the present invention there is provided an ultrasonic vibrating unit comprising:

- a piezoelectric vibrator having two end surfaces running perpendicular to the thickness direction of the piezoelectric vibrator;
- a pair of electrodes D and G, formed on the two end surfaces, respectively;
- electrode terminals $T_D$ and $T_G$, formed on the electrodes D and G, respectively;
- a vibrating plate connected to the electrode D or G; and
- at least one bar fixed to the vibrating plate such that one tip of the bar is in contact with one end surface of the vibrating plate or penetrates from one end surface to the other end surface thereof.

The piezoelectric vibrator, the vibrating plate and the bar form a vibrating assembly. The piezoelectric vibrator having a pillar-shaped body with a pierced hole located parallel to the thickness direction of the piezoelectric vibrator. The ratio of length in the thickness direction of the piezoelectric vibrator to the shortest distance between the outer edge and the inner edge of an end surface of the piezoelectric vibrator is approximately equal to 1. The vibrating plate covering an opening of the pierced hole. The electrode terminals $T_D$ and $T_G$ receive an electric signal with a frequency approximately equal to a resonance frequency of the piezoelectric vibrator and cause the piezoelectric vibrator to vibrate acoustically. The acoustic vibration is transmitted from the piezoelectric vibrator to the vibrating plate. The bar receives the acoustic vibration from the vibrating plate. A large vibration displacement is caused on the surface of the bar.

According to another aspect of the present invention there is provided an ultrasonic vibrating unit comprising:

- a piezoelectric vibrator having two end surfaces running perpendicular to the thickness direction of said piezoelectric vibrator;
- at least two electrodes D and F, formed on one end surface of said piezoelectric vibrator with electrically separated condition each other;
- at least one electrode G formed on the other end surface of said piezoelectric vibrator;
- electrode terminals $T_D$, $T_F$ and $T_G$, formed on said electrodes D, F and G, respectively;
- a vibrating plate connected to said electrode G; and
- at least one bar fixed to said vibrating plate such that one tip of said bar is in contact with one end surface of said vibrating plate or penetrates from one end surface to the other end surface thereof.

The piezoelectric vibrator, the vibrating plate and the bar form a vibrating assembly. The piezoelectric vibrator having a pillar-shaped body with a pierced hole located parallel to the thickness direction of the piezoelectric vibrator. The ratio of length in the thickness direction of the piezoelectric vibrator to the shortest distance between the outer edge and the inner edge of an end surface of the piezoelectric vibrator is approximately equal to 1. The vibrating plate covering an opening of the pierced hole. The electrode terminals $T_D$ and $T_G$ receive an electric signal with a frequency approximately equal to a resonance frequency of the piezoelectric vibrator and cause the piezoelectric vibrator to vibrate acoustically. The acoustic vibration is not only transmitted from the piezoelectric vibrator to the vibrating plate, but also transduced, between the electrode terminals $T_F$ and $T_G$, to an electric signal, with a frequency approximately equal to a resonance frequency of the vibrating assembly. The bar receives the acoustic vibration transmitted from the piezoelectric vibrator to the vibrating plate. A large vibration displacement is caused on the surface of the bar. The electrode terminals $T_F$ and $T_G$ deliver the electric signal transduced from the acoustic vibration.

According to another aspect of the present invention there is provided an ultrasonic vibrating unit, wherein the electrode D has approximately the same area on the one end surface of the piezoelectric vibrator as the electrode F, or the area not only more than the same as electrode F but also less than five times electrode F.

According to another aspect of the present invention there is provided a piezoelectric vibrator having a rectangular pillar-shaped body with a rectangular pillar-shaped pierced hole therein.

According to another aspect of the present invention there is provided a piezoelectric vibrator having a cylindrical-shaped body with a cylindrical-shaped pierced hole therein.

According to another aspect of the present invention there is provided a bar having a tubular or non-tubular structure, and having a branched or non-branched structure.

According to another aspect of the present invention there is provided a self-oscillator circuit containing

- a coil $L_1$ connected between a direct current power supply $V_{dc}$ and the electrode terminal $T_D$, and
- a transistor $T_{r1}$, output terminal thereof being connected to the electrode terminal $T_D$ and input terminal thereof being connected to the electrode terminal $T_F$. In the self-oscillator circuit, the piezoelectric vibrator acts as a resonance element and the transistor $T_{r1}$ acts as a feedback amplifier element.

According to another aspect of the present invention there is provided a self-oscillator circuit consisting of a current sensing circuit for detecting the phase of a current in the piezoelectric vibrator, the current sensing circuit containing two diodes $D_1$ and $D_2$, the diode $D_1$ being connected in series to the piezoelectric vibrator, the diode $D_2$ being connected in parallel to the diode $D_1$, a voltage amplifying circuit for amplifying a low voltage signal detected in the current sensing circuit, and a power amplifying circuit containing a transistor $T_{r1}$ and a coil $L_1$ for supplying the piezoelectric vibrator with an electric power. In the self-oscillator circuit, the piezoelectric vibrator acts as a resonance element and the transistor $T_{r1}$ acts as a feedback amplifier element.

According to another aspect of the present invention there is provided an ultrasonic vibrating actuator comprising the ultrasonic vibrating unit having the two electrodes D and G formed on the two end surfaces of the piezoelectric vibrator, respectively, and at least one moving element being in contact with the surface of the bar. The moving element is made to move by the vibration displacement caused on the surface of the bar.

According to another aspect of the present invention there is provided an ultrasonic vibrating actuator comprising the ultrasonic vibrating unit having the two electrodes D and F formed o.n one end surface of the piezoelectric vibrator and the electrode G formed on the other end surface of the piezoelectric vibrator, and at least one moving element being in contact with the surface of the bar. The moving element is made to move by the vibration displacement caused on the surface of the bar.

According to other aspect of the present invention there is provided a moving element being in contact with one tip of the bar. The moving element is rotated on the tip of the bar round the rotation axis parallel to the longitudinal direction of the bar.

According to a further aspect of the present invention there is provided a moving element being in contact with side of the bar. The moving element is moved or pendulated along the longitudinal direction of the bar.

BRIEF DESCRIPTION OF THE DRAWINGS

Other features and advantages of the invention will be clarified from the following description with reference to the attached drawings.

DETAILED DESCRIPTION OF THE PRESENTLY PREFERRED EXEMPLARY EMBODIMENTS

Figure 1:
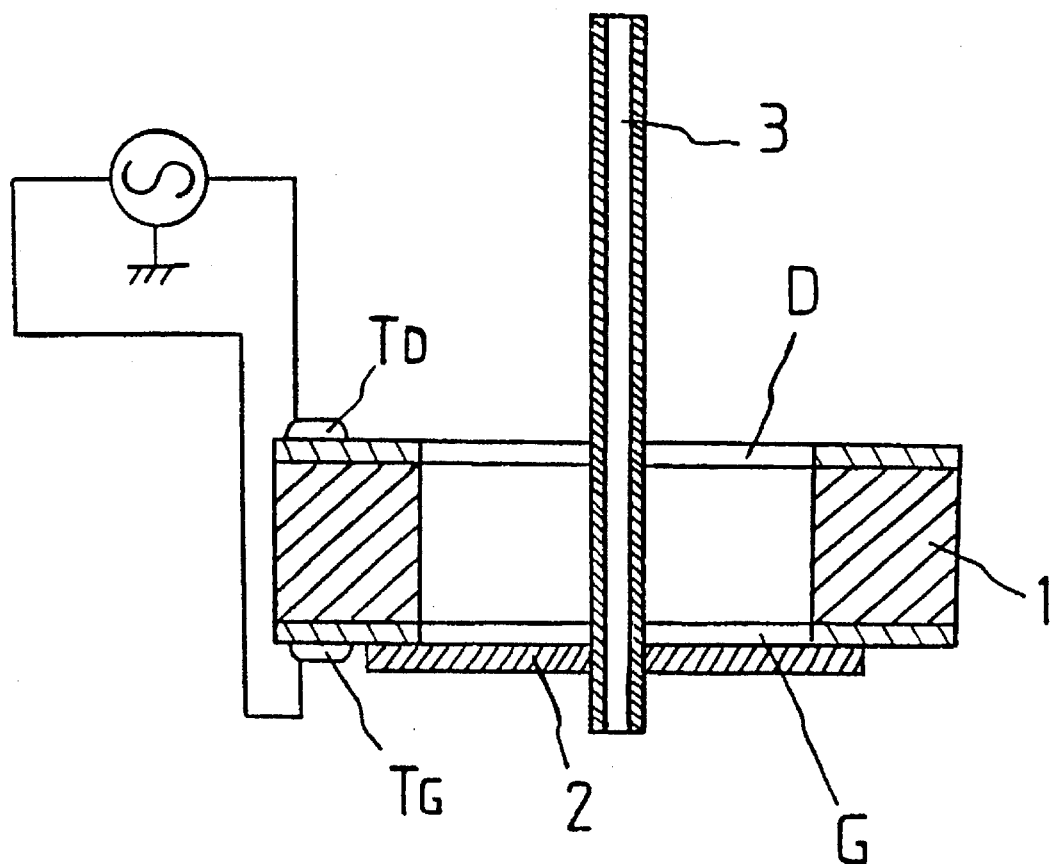
FIG. 1 shows a sectional view of the ultrasonic vibrating unit according to a first embodiment of the present invention.

FIG. 1 shows a sectional view of an ultrasonic vibrating unit according to a first embodiment of the present invention. The ultrasonic vibrating unit comprises a piezoelectric vibrator 1, a vibrating plate 2, a bar 3, a pair of electrodes D and G made from aluminium thin film, and electrode terminals $T_D$ and $T_G$, made from copper ribbon and cemented on the electrodes D and G, respectively, by an adhesive agent which is of high conductivity. Also shown is a power supply circuit supplying the piezoelectric vibrator 1 with an alternating current voltage.

Figure 2:
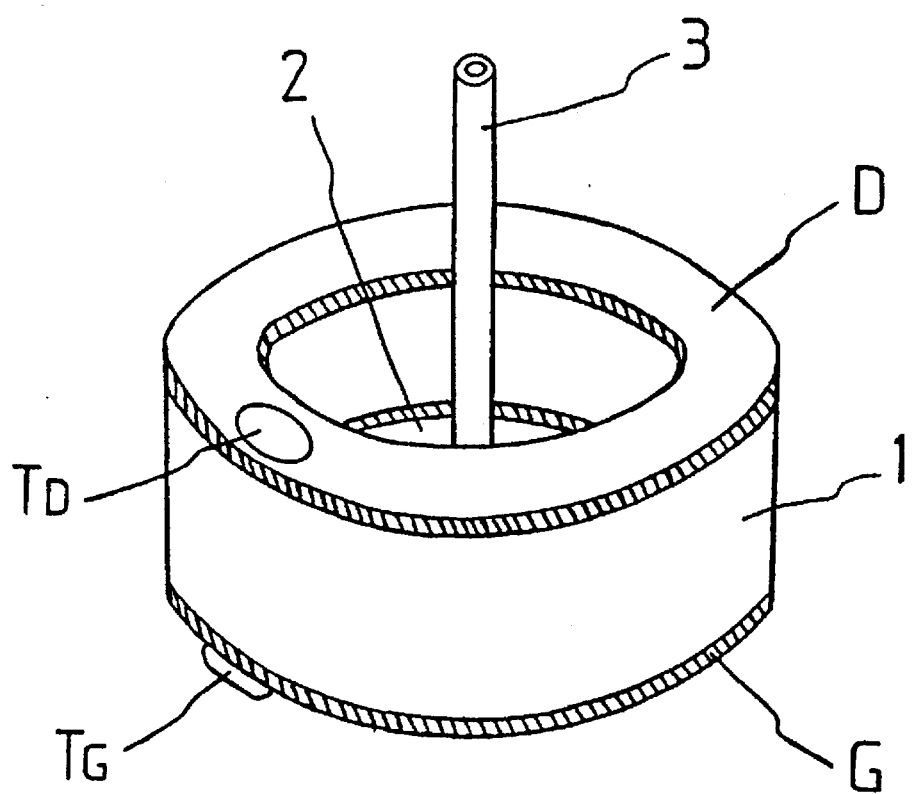
FIG. 2 shows a perspective view of the ultrasonic vibrating unit shown in FIG. 1.

FIG. 2 shows a perspective view of the ultrasonic vibrating unit shown in FIG. 1. The power supply circuit is not drawn in FIG. 2. The piezoelectric vibrator 1 made of a TDK-91A piezoelectric ceramic (TDK Company) providing a high electromechanical coupling constant has a cylindrical-shaped body, with dimensions of 4 mm in thickness and 14 mm in diameter, and having a cylindrical-shaped pierced hole therein parallel to the thickness direction thereof and with dimensions of 4 mm in thickness and 8 mm in diameter. The piezoelectric vibrator 1 has two end surfaces running perpendicular to the thickness direction thereof. The direction of the polarization axis of the piezoelectric vibrator 1 is parallel to the thickness direction thereof. The electrodes D and G are formed on the two end surfaces, respectively. The electrode terminals $T_D$ and $T_G$ are mounted on the electrodes D and G, respectively. The vibrating plate 2 made of stainless steel having a disk-like body has a first surface portion and a second surface portion on one end surface thereof, the first surface portion being cemented to the piezoelectric vibrator 1 with an electroconductive epoxy resin (Dotite, Fujikura Chemical) and in contact with the electrode G such that the vibrating plate 2 is mounted at a position which covers the opening of the pierced hole of the piezoelectric vibrator 1, the second surface portion being surrounded by the ring-like first surface portion. The dimensions of the vibrating plate 2 are 10 mm in diameter and 0.05 mm in thickness. The bar 3 made of brass has a tube-type structure with dimensions of 0.6 mm in diameter of outer edge, 0.4 mm in diameter of inner edge and 10 cm in length, and is cemented to the vibrating plate 2 at a position such that one tip of the bar 3 penetrates vibrating plate 2.

Figure 3:
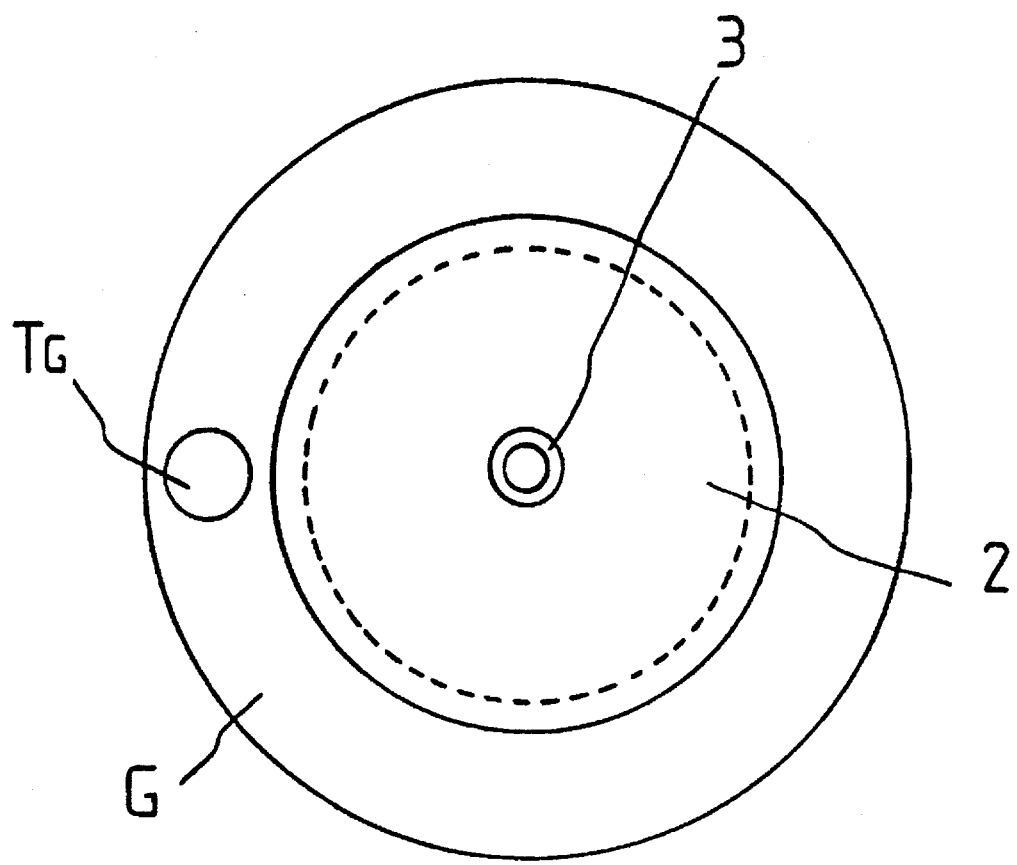
FIG. 3 shows a bottom plan view of the ultrasonic vibrating unit shown in FIG. 1.

FIG. 3 shows a bottom plan view of the ultrasonic vibrating unit shown in FIG. 1. The power supply circuit is not drawn in FIG. 3.

When an electric signal with a frequency substantially equal to one of the resonance frequencies of the piezoelectric vibrator 1 is applied to the piezoelectric vibrator 1 through the electrode terminals $T_D$ and $T_G$, the piezoelectric vibrator 1 is vibrated mechanically. The acoustic vibration is transmitted to the vibrating plate 2 through the first surface portion of the vibrating plate 2. The bar 3 receives the acoustic vibration from the vibrating plate 2. A large vibration displacement is caused on the surface of the bar 3. The piezoelectric vibrator 1, the vibrating plate 2 and the bar 3 form a vibrating assembly.

The ultrasonic vibrating unit shown in FIG. 1 has the piezoelectric vibrator 1 with a pillar-shaped body having a pierced hole located parallel to the thickness direction of the piezoelectric vibrator 1, the ratio of the dimension in thickness to the shortest distance between the outer edge and the inner edge of an end surface of the piezoelectric vibrator 1 being approximately equal to 1. Therefore, a coupled-mode vibration of the vibrating assembly is strengthened. Thus, acoustic vibration can be transmitted to all the bar 3 over. The vibrating plate 2 is fixed to be integrally interlocked with the piezoelectric vibrator 1 by the first surface portion of the vibrating plate 2, almost parallel to the end surfaces of the piezoelectric vibrator 1, on the position which covers the opening of the pierced hole of the piezoelectric vibrator 1. Therefore, the vibrating plate 2 can be made to vibrate effectively. Accordingly, the acoustic vibration can be transmitted to all the bar 3 fixed to be interlocked with the vibrating plate 2 effectively.

Figure 4:
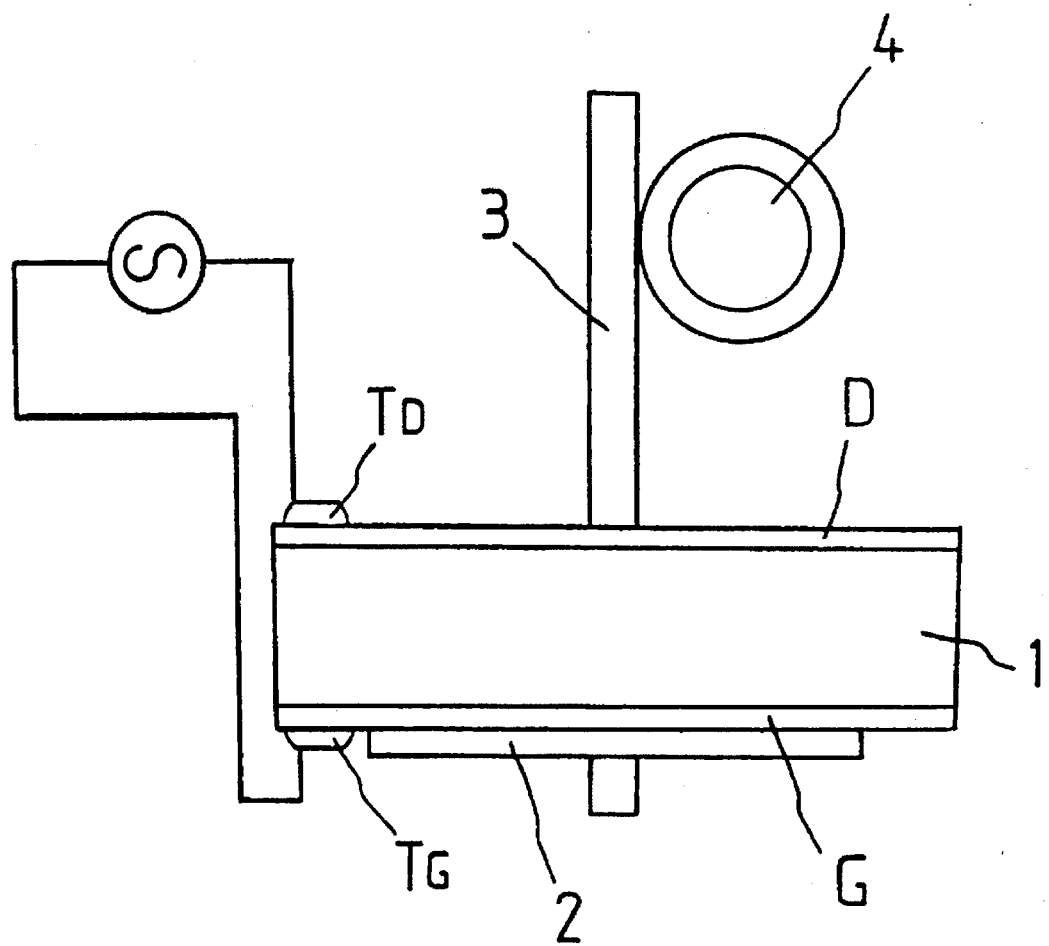
FIG. 4 shows a side view of an embodiment of the ultrasonic vibrating actuator according to the present invention.

FIG. 4 shows a side view of an embodiment of an ultrasonic vibrating actuator according to the present invention. The ultrasonic vibrating actuator contains the ultrasonic vibrating unit shown in FIG. 1 and a rotor 4, which is in contact with side surface of the bar 3 and pressed against the side surface thereof in the longitudinal direction thereof.

Figure 5:
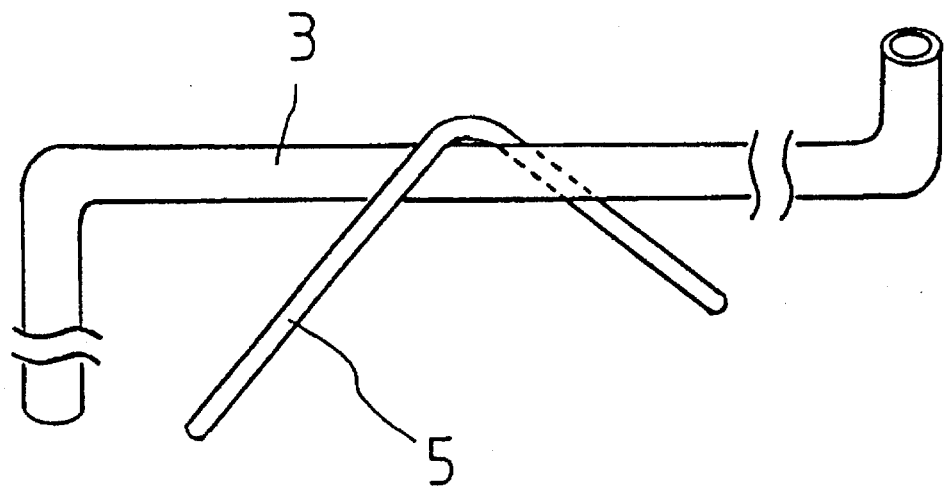
FIG. 5 shows the pendulum 5 used instead of the rotor 4.

FIG. 5 shows a pendulum 5 used instead of the rotor 4. The pendulum 5 is in contact with the side surface of the bar 3 and balanced on the side surface thereof, then when the bar 3 is located such that the longitudinal direction thereof is along the horizontal direction.

Figure 6:
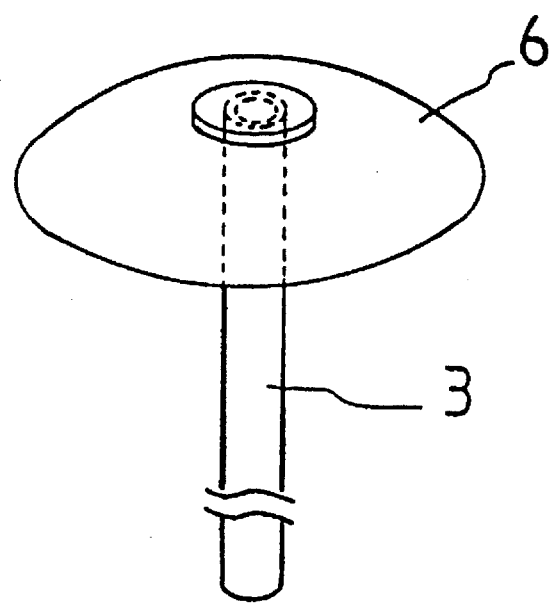
FIG. 6 shows the dish 6 used instead of the rotor 4.

FIG. 6 shows a dish 6 used instead of the rotor 4. The dish 6 is in contact with the top surface of the bar 3.

When operating the ultrasonic vibrating actuator of FIG. 4, the rotor 4 is rotated by a vibration displacement caused on the side surface of the bar 3. The pendulum 5 is pendulated along the longitudinal direction of the bar 3 by the vibration displacement caused on the side surface of the bar 3. The dish 6 is rotated on the top surface of the bar 3 by a vibration displacement caused on the top surface of the bar 3. In this time, it is possible to move the rotor 4, the pendulum 5 and the dish 6 in the same time with various speed, and use even a bar, of which the length is approximately 1 m, and a bar, of which one tip is in contact with one end surface of the vibrating plate 2, instead of the bar 3. In addition, it is possible to convert the rotatory direction of the rotor 4 by changing the touch position of the rotor 4 to the bar 3, and the rotatory direction of the dish 6 by changing the length of the bar 3. Therefore, it is possible to control the magnitude and the direction of the vibration displacement.

Figure 7:
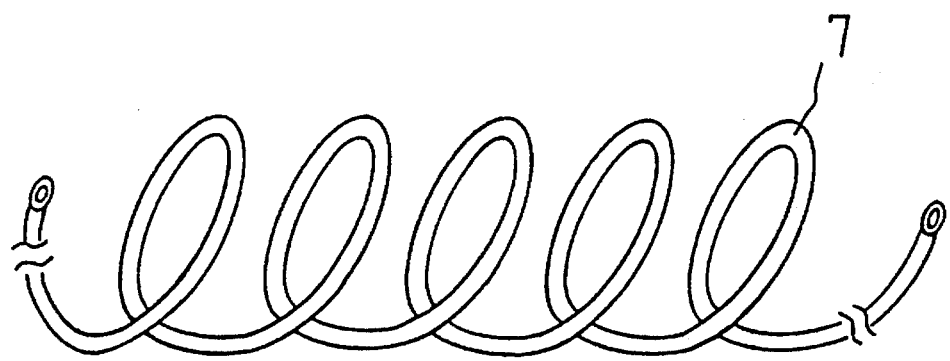
FIG. 7 shows a perspective view of the bar 7 used instead of the bar 3.

FIG. 7 shows a perspective view of a bar 7 used instead of the bar 3. The bar 7 having a coiled tube structure can move the rotor 4, the pendulum 5 or the dish 6 in the same way as the bar 3. When the bar 7 is used instead of the bar 3 in the ultrasonic vibrating actuator shown in FIG. 4, the rotor 4 and the pendulum 5 are moved even on side surface near the top of the bar 7, respectively, and the dish 6 is moved even on the top surface of the bar 7. Thus, various types of moving elements, such as the rotor 4, the pendulum 5 and the dish 6, can be driven by a bar, whether which is straight or not, and is tubular or not.

Figure 8:
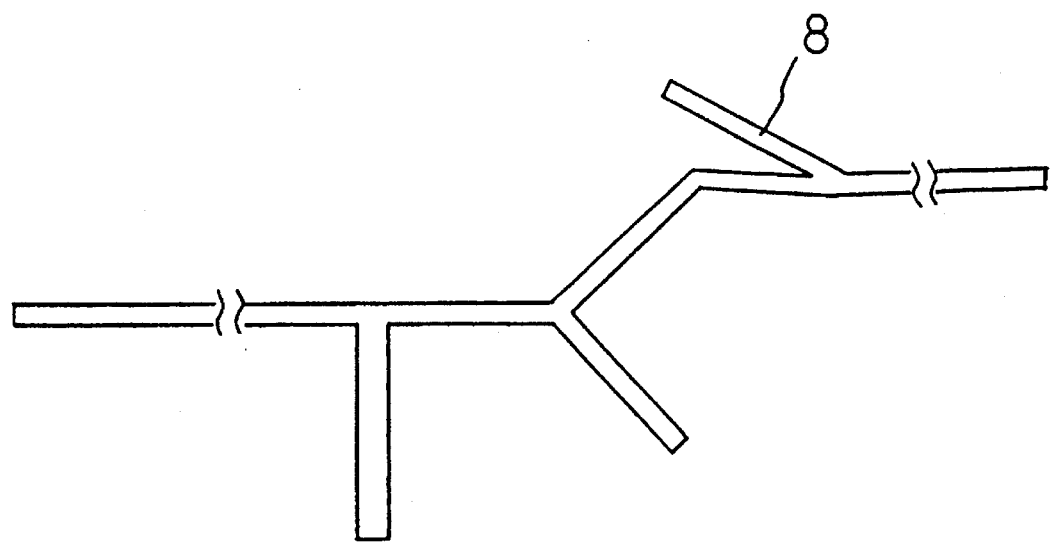
FIG. 8 shows a perspective view of the bar 8 used instead of the bar 3.

FIG. 8 shows a perspective view of a bar 8 used instead of the bar 3. The bar 8 with a branched structure, of which sectional view is rectangular, can move the rotor 4, the pendulum 5 or the dish 6 in the same way as the bar 3. When the bar 8 is used instead of the bar 3 in the ultrasonic vibrating actuator shown in FIG. 4, the rotor 4 and the pendulum 5 are moved even on the side surface near each top of the bar 8, respectively, and the dish 6 is moved even on each top surface of the bar 8. Thus, various types of moving elements can be driven by a bar, whether which has branches or not, and whether of which sectional view is rectangular, circular or another shaped. Various types of bars, such as the bar 3, the bar 7 and the bar 8, can be covered with films, made of polymer and so on, and causing a friction between each bar and each moving element. A low power consumption can be realized by use of the friction between each bar and each moving element.

Figure 9:
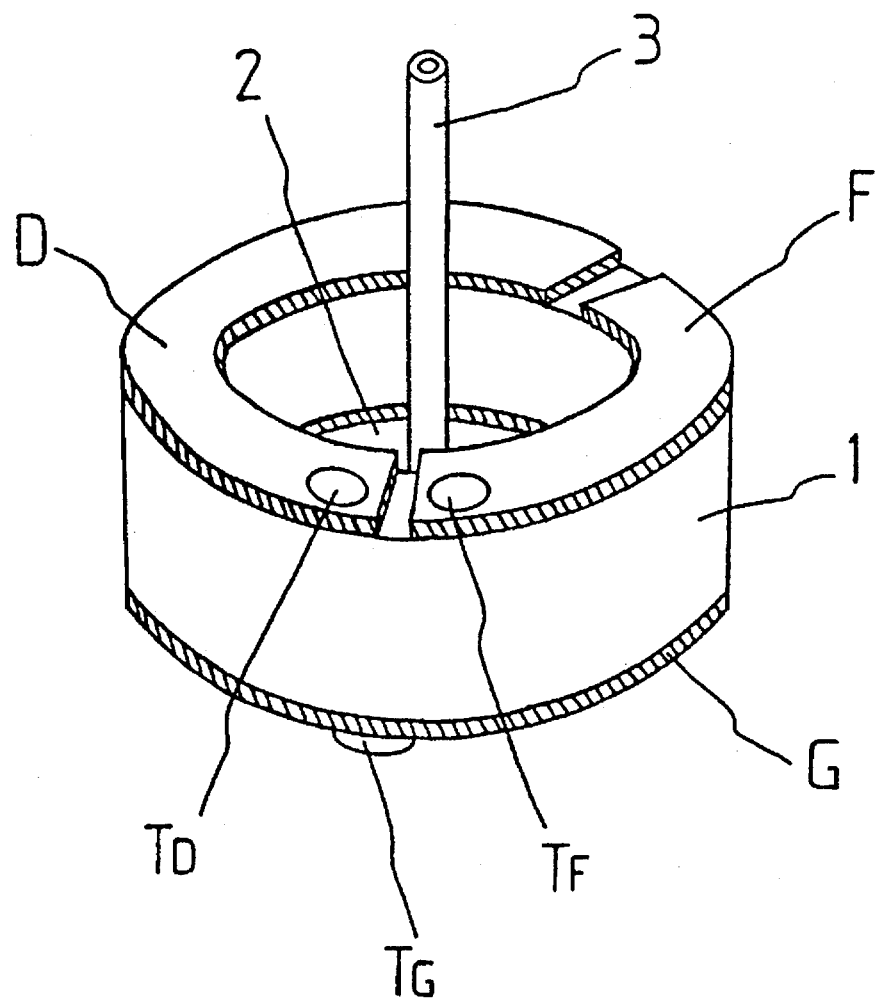
FIG. 9 shows a perspective view of the ultrasonic vibrating unit according to a second embodiment of the present invention.

FIG. 9 shows a perspective view of an ultrasonic vibrating unit according to a second embodiment of the present invention. The ultrasonic vibrating unit comprises the piezoelectric vibrator 1, the vibrating plate 2, the bar 3, a self-oscillator circuit 9, electrodes D and F, formed on one end surface of the piezoelectric vibrator 1 with electrically separated condition each other, an electrode G formed on the other end surface of the piezoelectric vibrator 1, electrode terminals $T_D$, $T_F$ and $T_G$, formed on the electrodes D, F and G, respectively. The self-oscillator circuit 9 is not drawn in FIG. 9. The electrodes D, F and G, are made from aluminium thin film. The electrode terminals $T_D$, $T_F$ and $T_G$, are made from copper ribbon and cemented on the electrodes D, F and G, respectively, by an adhesive agent which is of high conductivity. The piezoelectric vibrator 1, the vibrating plate 2 and the bar 3 form a vibrating assembly.

Figure 10:
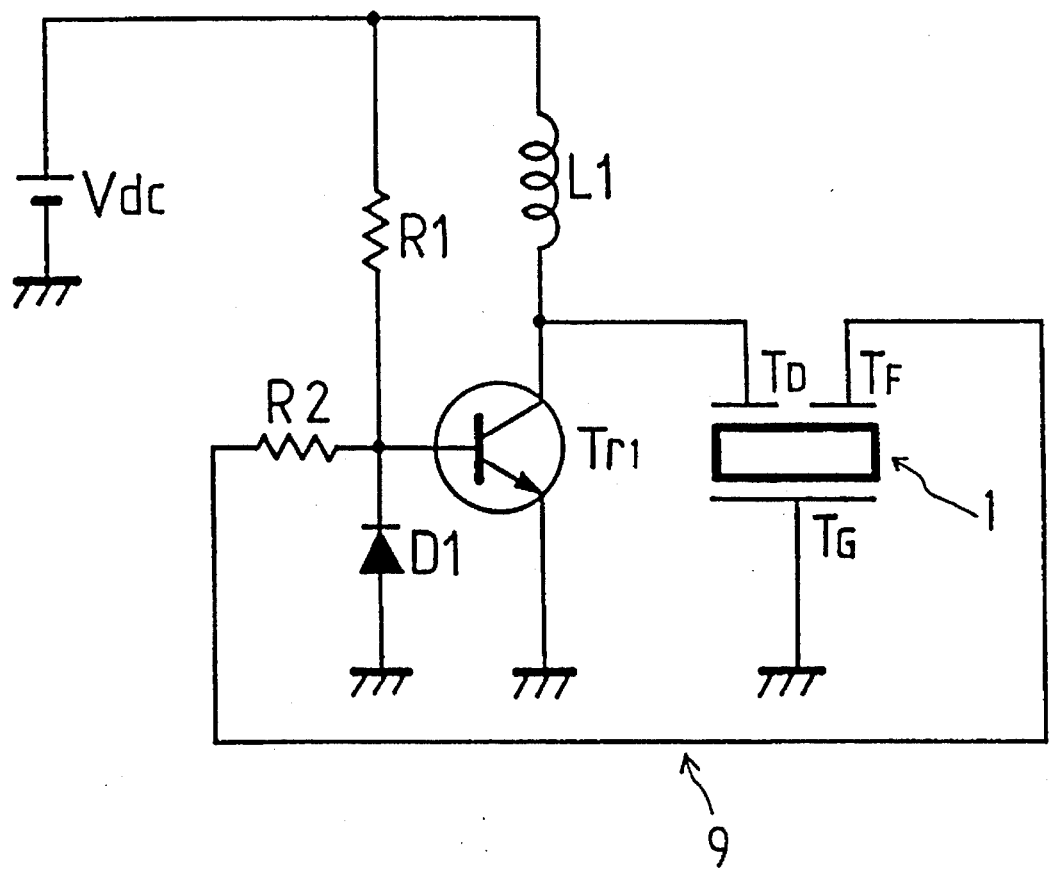
FIG. 10 shows a diagram of the self-oscillator circuit 9.

FIG. 10 shows a diagram of the self-oscillator circuit 9. The self-oscillator circuit 9 contains a coil $L_1$ connected between a direct current power supply $V_{dc}$ and the electrode terminal $T_D$, and a transistor $T_{r1}$, an output terminal thereof being connected to the electrode terminal $T_D$ and an input terminal thereof being connected to the electrode terminal $T_F$. When an electric signal with a frequency substantially equal to one of the resonance frequencies of the piezoelectric vibrator 1 is applied to the piezoelectric vibrator 1 through the electrode terminals $T_D$ and $T_G$, the piezoelectric vibrator 1 is vibrated mechanically. The acoustic vibration is not only transmitted from the piezoelectric vibrator i to the vibrating plate 2 through the first surface portion of the vibrating plate 2, but also transduced, between the electrode terminals $T_F$ and $T_G$, to an electric signal, with a frequency approximately equal to a resonance frequency of the vibrating assembly. The bar 3 receives the acoustic vibration transmitted from the piezoelectric vibrator 1 to the vibrating plate 2. A large vibration displacement is caused on the surface of the bar 3. The voltage between the electrode terminals $T_F$ and $T_G$, that arises from the piezoelectricity of the piezoelectric vibrator 1 as a resonance element, is fedback via the transistor $T_{r1}$, operating as a feedback amplifier element. The electric signals at the electrode terminals $T_D$ and $T_F$ are 180° out of phase. The voltage across the coil L, is applied to the electrode terminals $T_D$ and $T_G$. In this way, a positive feedback loop with the best self-oscillation is constructed. The self-oscillator circuit 9 has been confirmed to work for continuous and stable acoustic vibration of the piezoelectric vibrator 1 without special compensation, for considerably large resonance frequency deviation of the piezoelectric vibrator 1 in the temperature range below 80° C. Moreover, it is possible to construct the self-oscillator circuit 9 with few parts such as the coil $L_1$, the transistor $T_{r1}$, resistances $R_1$ and $R_2$, and a diode $D_1$, and use the direct current power supply $V_{dc}$, causing a high power consumption efficiency, though such few parts. Thus, it is possible to miniaturize the power supply. Therefore, the ultrasonic vibrating unit has a small size with a simple structure.

Figure 11:
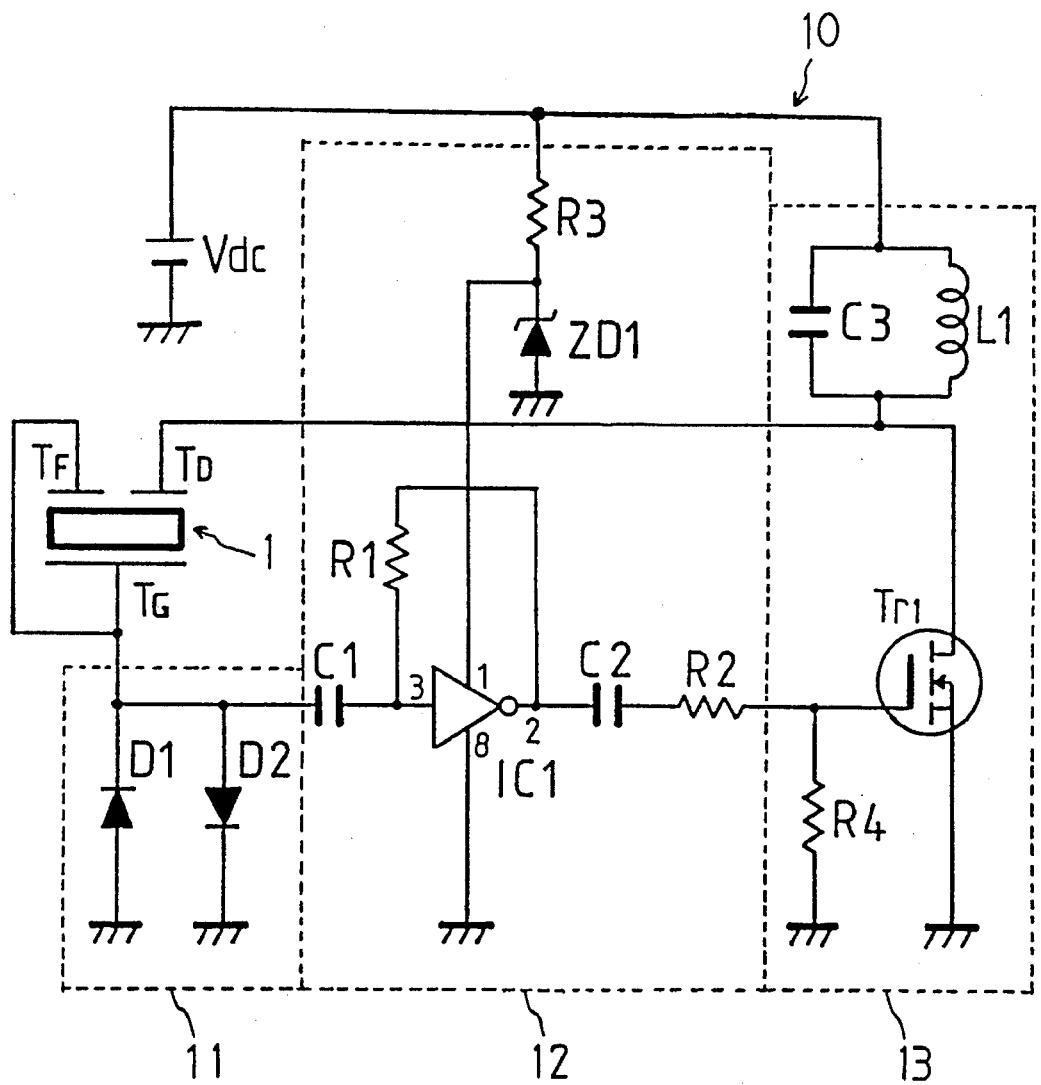
FIG. 11 shows a diagram of the self-oscillator circuit 10 used instead of the self-oscillator circuit 9.

FIG. 11 shows a diagram of a self-oscillator circuit 10 used instead of the self-oscillator circuit 9. The self-oscillator circuit 10 comprises a current sensing circuit 11, a voltage amplifying circuit 12 and a power amplifying circuit 13. The self-oscillator circuit 10 has been confirmed to work for continuous and stable acoustic vibration of the piezoelectric vibrator 1 without special compensation, for considerably large resonance frequency deviation of the piezoelectric vibrator 1 in the temperature range below 80° C. The current sensing circuit 11 contains a diode $D_1$ connected in series to the electrode terminals $T_F$ and $T_G$, and a diode $D_2$ connected in parallel to the diode $D_1$ with the opposite polarity to the diode $D_1$, the current sensing circuit 11 detecting a phase of a current between the electrode terminals $T_F$ and $T_G$. Thus, an electric signal, in which a phase between the current and the voltage is zero and having a frequency corresponding to a frequency substantially equal to one of the resonance frequencies of the vibrating assembly, is delivered from the electrode terminals $T_F$ and $T_G$ toward the current sensing circuit 11. In proportion as an impedance of the current sensing circuit 11 is larger, the voltage provided to the piezoelectric vibrator 1 becomes lower. Therefore, the current sensing circuit 11 is favourable to have a smaller impedance. However, if the impedance is too small, the detected voltage becomes low. Accordingly, the rise time for self-oscillation becomes late. Generally, a diode acts as a high-resistance when self-oscillation begins and then the voltage is low, and as a low-resistance when self-oscillation is stabilized and then the voltage is high, considering the relationship between the current and the voltage in the diode. Accordingly, the diodes $D_1$ and $D_2$ are favorable as elements in the current sensing circuit 11. The voltage amplifying circuit 12 contains an inverter $IC_1$, condensers $C_1$ and $C_2$ for cutting the direct current component, a Zener diode $ZD_1$, and resistances $R_1$, $R_2$ and $R_3$. The voltage amplifying circuit 12 is intended for amplifying a weak voltage signal detected in the current sensing circuit 11 and driving the next circuit, that is the power amplifying circuit 13. For the purpose of obtaining enough high-frequency power to drive the piezoelectric vibrator 1 when a power amplifying means is composed of a transistor and so on, a voltage amplifying circuit with an amplifier is necessary for obtaining a large gain at high speed. In FIG. 11, the inverter $IC_1$ composed of CMOS logic IC is used. When feedbacking the inverter IC, via the resistance $R_1$, the voltage amplifying circuit 12 does not work around the threshold. Thus, the voltage amplifying circuit 12 acts as an analog amplifier. Though the voltage amplifying circuit 12 has a large gain at high speed, there is a voltage limit in the power supply. Therefore, the inverter $IC_1$ is supplied with a fixed voltage by using the Zener diode $ZD_1$. The power amplifying circuit 13 contains a transistor $T_{r1}$, a coil $L_1$, a condenser $C_3$ and a resistance $R_4$, an output power of the power amplifying circuit 13 being applied through the electrode terminals $T_D$ and $T_G$. The transistor $T_{r1}$ is for switching, and uses a power MOSFET in consideration of a switching speed and a simplicity of driving. The coil $L_1$ is used for supplying the piezoelectric vibrator 1 with a power having a voltage higher than the power supply voltage by generating an electromotive force. The condenser $C_3$ is for regulating the time constant of electromotive force. When enhancing the condenser $C_3$, the time constant becomes larger and the maximum voltage is lower. When reducing the condenser $C_3$, the time constant is smaller and the maximum voltage is higher.

When operating the ultrasonic vibrating unit shown in FIG. 9 with the self-oscillator circuit 10, for example, 50 $V_{p-p}$ is obtained as the driving voltage of the piezoelectric vibrator 1, if the power supply voltage is 12 V. At this time, an alternating current voltage of approximately 1 $V_{p-p}$ is taken out at the electrode terminals $T_F$ and $T_G$. Thus, the piezoelectric vibrator 1 can be driven with a voltage approximately four times larger than the power supply voltage. In the self-oscillator circuit 10 the transistor $T_{r1}$ and the coil $L_1$ for switching are used in order to make it possible to drive at a low voltage. When enhancing a voltage by using a combination of a transistor and a coil or by a transducer to the same degree, a combination of a transistor and a coil has a smaller size which is very light in weight and is cheaper than a transducer. In addition, since the load circuit of the power amplifying circuit 13 contains the coil $L_1$ and the condenser $C_3$ without a resistor, the energy conversion efficiency increases.

Another embodiment of an ultrasonic vibrating actuator according to the present invention is provided, the ultrasonic vibrating actuator containing the ultrasonic vibrating unit, shown in FIG. 9, and the rotor 4. The pendulum 5 or the dish 6 is also available in the ultrasonic vibrating actuator. The rotor 4, the pendulum 5 or the dish 6, which can be made to move in the same way as in FIG. 4, is operated under a lower voltage with lower power consumption than in FIG. 4. Besides, the ultrasonic vibrating actuator has stable output characteristics over a long time.

Figure 12:
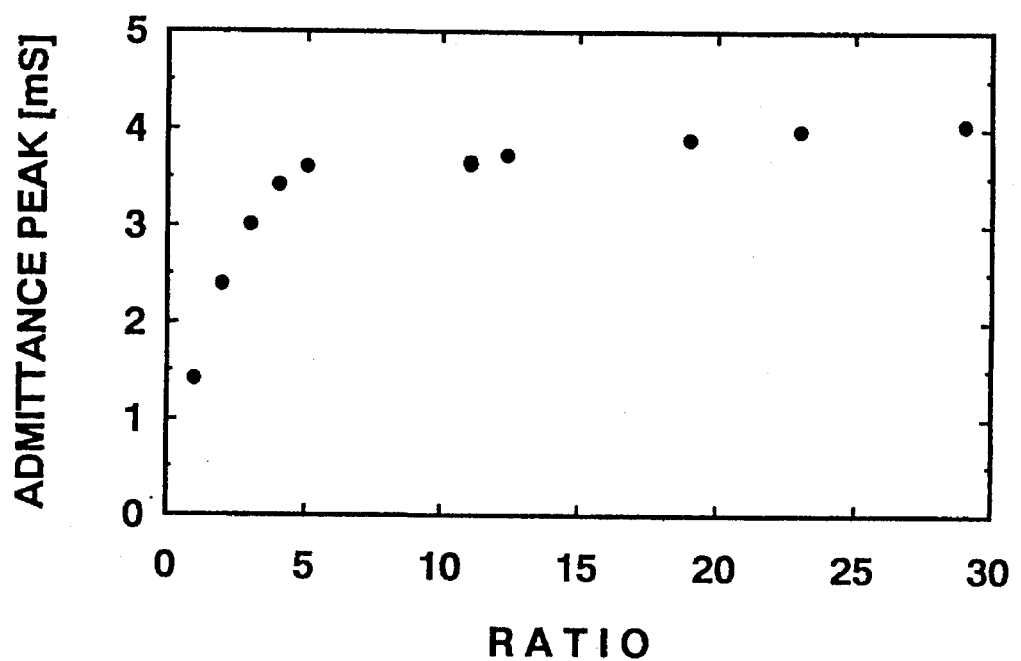
FIG. 12 shows the relationship between the area ratio of the electrode D on the one end surface of the piezoelectric vibrator 1 to the electrode F, and the admittance peak between the electrodes D and G, or the amplitude of the alternating current voltage applied to the electrode D shown in FIG. 9.
Figure 12:
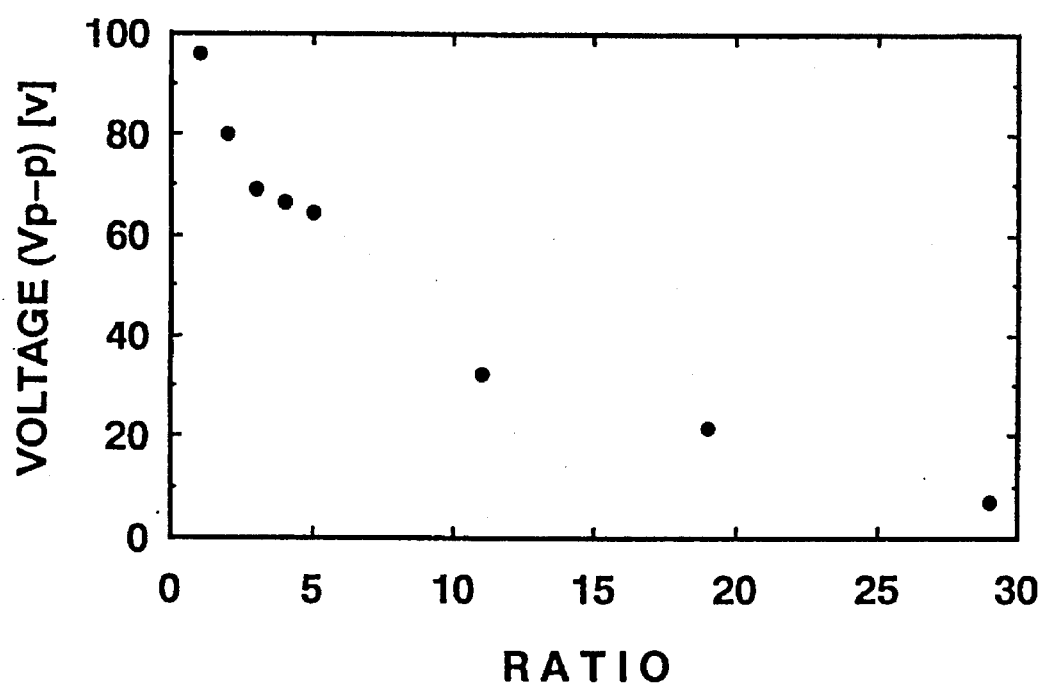

FIG. 12 shows the relationship between the area ratio of the electrode D on the one end surface of the piezoelectric vibrator 1 to the electrode F, and the admittance peak between the electrodes D and G, or the amplitude of the alternating current voltage applied to the electrode D shown in FIG. 9. FIG. 12 is provided that the dimension of the bar 3 is 46 mm in length, and the voltage of direct current power supply $V_{dc}$ is 9 V. When the electrode D has the same area as the electrode F, the amplitude of the alternating current voltage applied to the electrodes D is 97 $V_{p-p}$.

Figure 13:
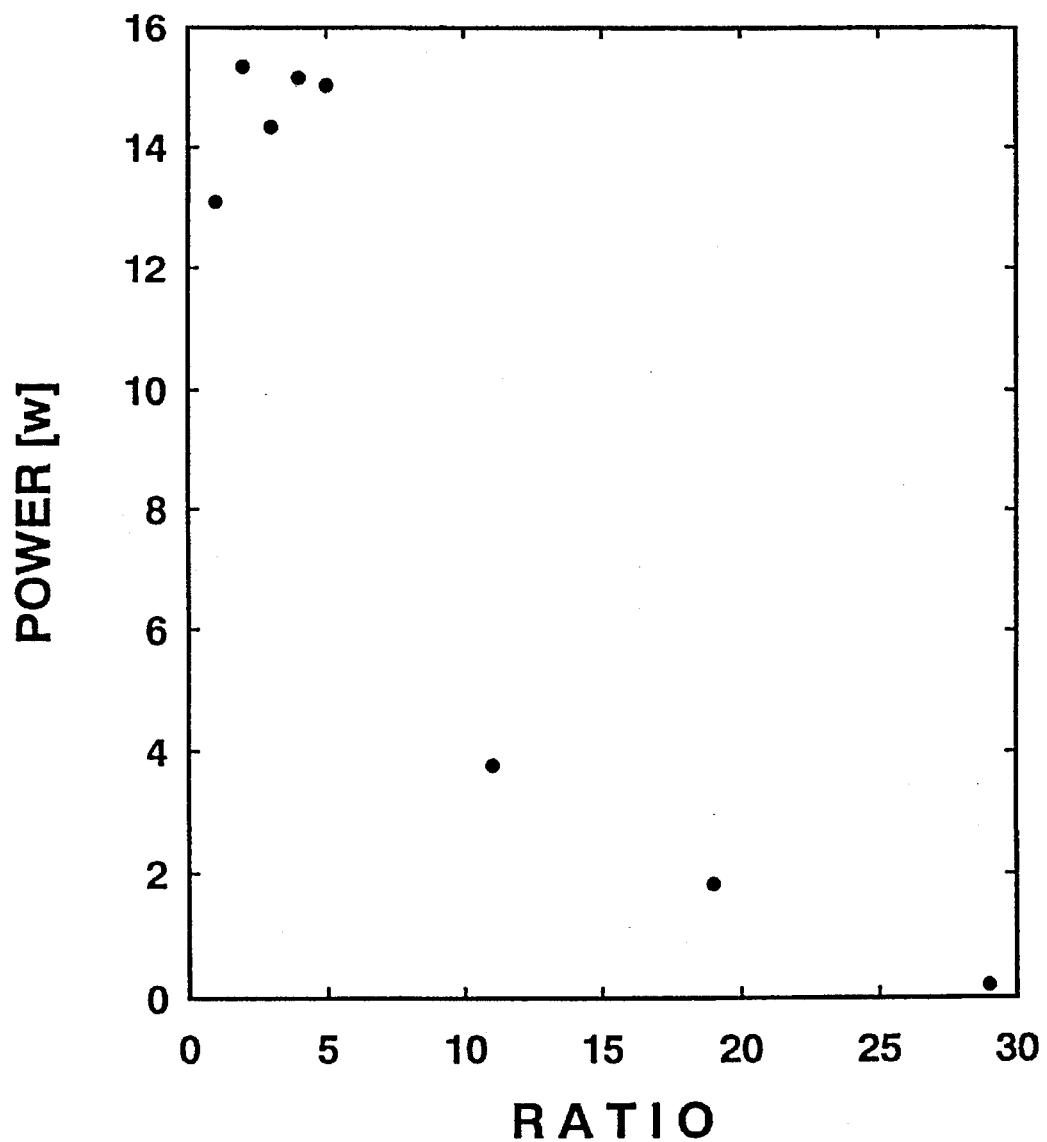
FIG. 13 shows the relationship between the area ratio of the electrode D on the one end surface of the piezoelectric vibrator 1 to the electrode F, and the electric power supplied to the electrode D shown in FIG. 9.

FIG. 13 shows the relationship between the area ratio of the electrode D on the one end surface of the piezoelectric vibrator 1 to the electrode F, and the electric power supplied to the electrode D shown in FIG. 9. FIG. 13 is provided that the dimension of the bar 3 is 46 mm in length, and the voltage of the direct current power supply $V_{dc}$ is 9 V. When the electrode D has two times as large area as the electrode F, the electric power supplied to the electrode D is 15.5 W. Thus, particularly high electric power supplied to the electrode D is obtained, when the electrode D has one, two, three, four or five times as large area as the electrode F. This means that the same electric power as except when the electrode D has one, two, three, four or five times as large area as the electrode F is obtained by a lower voltage of the direct current power supply $V_{dc}$. Accordingly, it is possible to operate the vibrating assembly effectively under low voltage of the direct current power supply $V_{dc}$. Consequently, the vibrating assembly can be made to operate effectively, when the electrode D has the same area on the one end surface of the piezoelectric vibrator 1 as the electrode F, or the area not only more than the same as the electrode F but also less than five times the electrode F.

Figure 14:
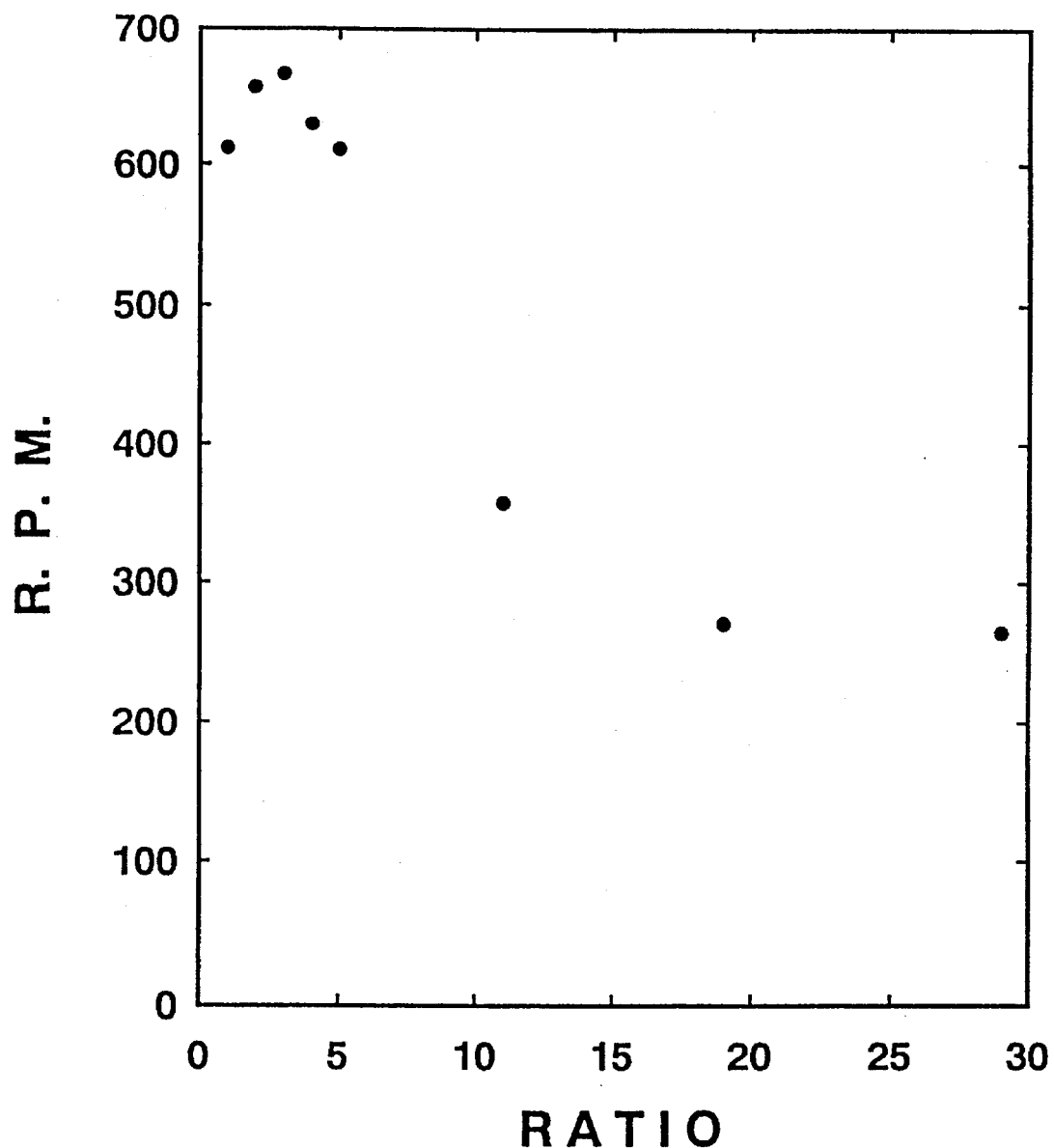
FIG. 14 shows the relationship between the revolution per minute (R.P.M) of the rotor 4 and the area ratio of the electrode D on the one end surface of the piezoelectric vibrator I to the electrode F, shown in FIG. 9.

FIG. 14 shows the relationship between the revolution per minute (R.P.M) of the rotor 4 and the area ratio of the electrode D on the one end surface of the piezoelectric vibrator 1 to the electrode F, shown in FIG. 9. FIG. 14 is provided that the voltage of the direct current power supply $V_{dc}$ is 9 V. The R.P.M has the maximum value, when the electrode D has three times as large area as the electrode F.

Figure 15:
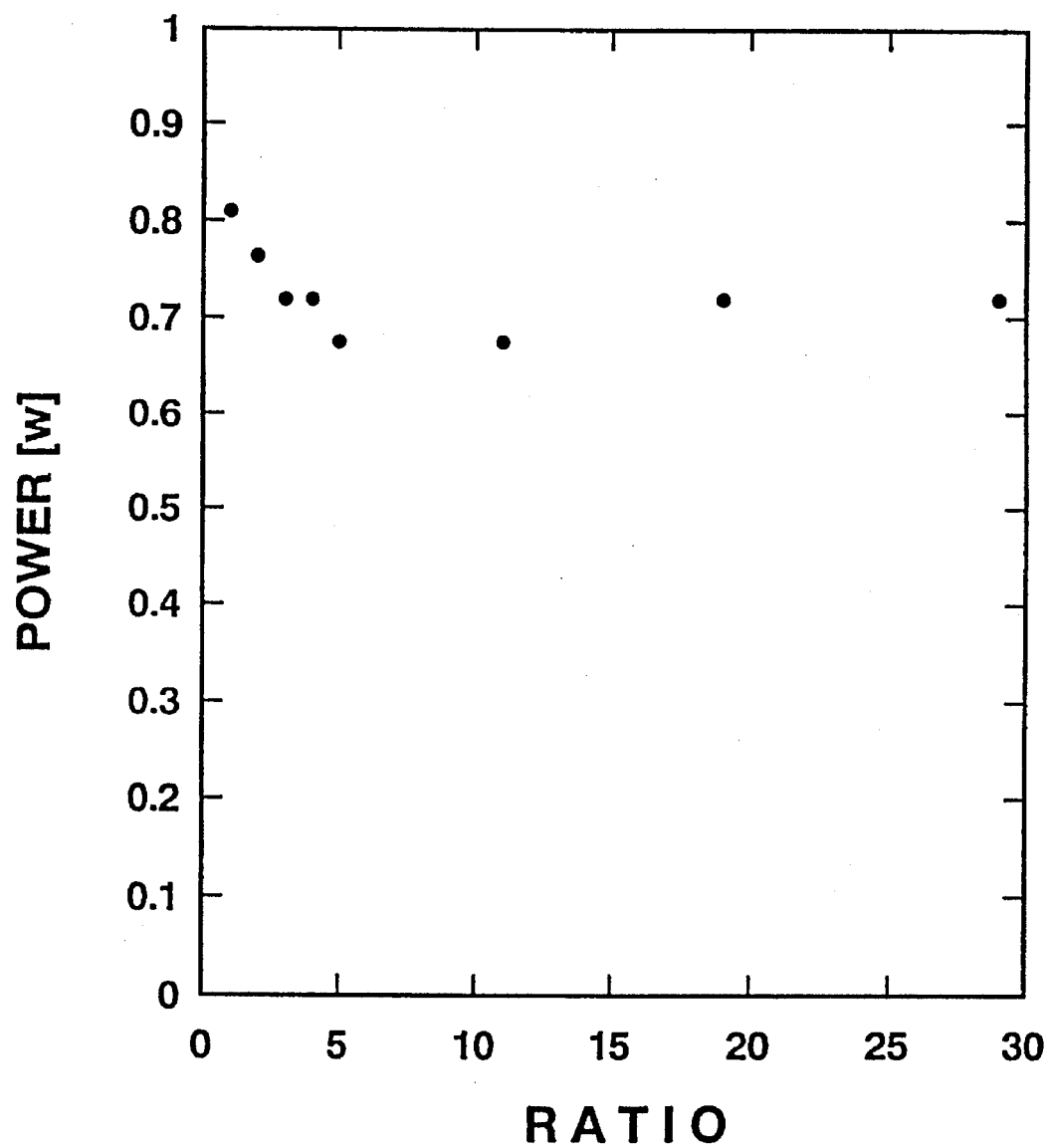
FIG. 15 shows the relationship between the power consumption at direct current power supply $V_{dc}$ and the area ratio of the electrode D on the one end surface of the piezoelectric vibrator 1 to the electrode F, shown in FIG. 9.

FIG. 15 shows the relationship between the power consumption at direct current power supply $V_{dc}$ and the area ratio of the electrode D on the one end surface of the piezoelectric vibrator 1 to the electrode F, shown in FIG. 9. FIG. 15 is provided that the voltage of the direct current power supply $V_{dc}$ is 9 V. When the electrode D has four or ten times as large area as the electrode F, the power consumption has the minimum value of 0.68 W.

Figure 16:
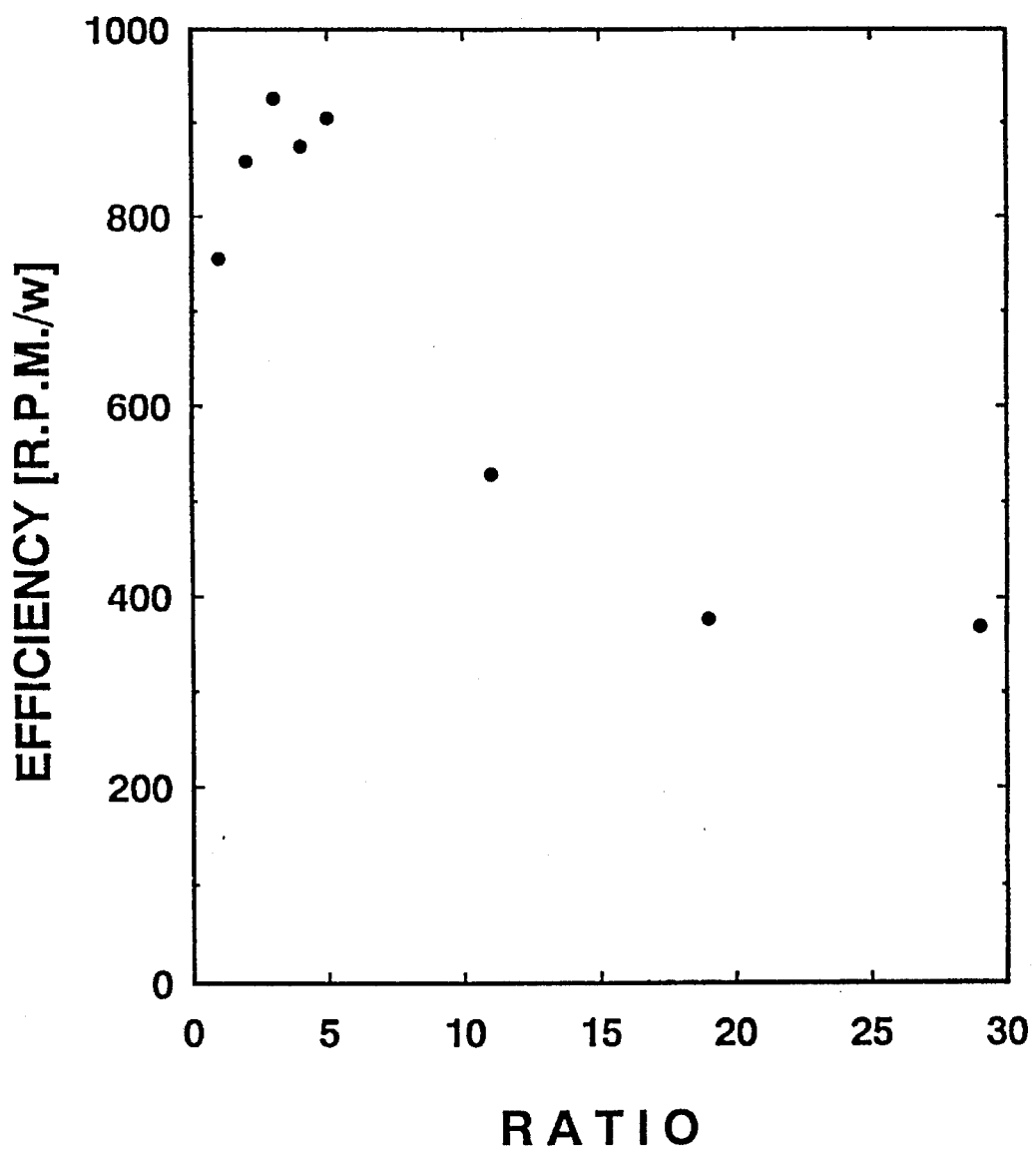
FIG. 16 shows the relationship between the revolution efficiency and the area ratio of the electrode D on the one end surface of the piezoelectric vibrator 1 to the electrode F, shown in FIG. 9.

FIG. 16 shows the relationship between the revolution efficiency and the area ratio of the electrode D on the one end surface of the piezoelectric vibrator 1 to the electrode F, shown in FIG. 9. The revolution efficiency calculated by FIGS. 14 and 15 is the revolution per power consumption, and has the maximum value, when the electrode D has three times as large area as the electrode F.

It is clear from FIGS. 12, 13, 14, 15 and 16 that the ultrasonic vibrating actuator can be operated under low voltage with low power consumption, when the electrode D has the same area on the one end surface of the piezoelectric vibrator i as the electrode F, or the area not only more than the same as the electrode F but also less than five times the electrode F. In this time, the best revolution efficiency is obtained.

Figure 17:
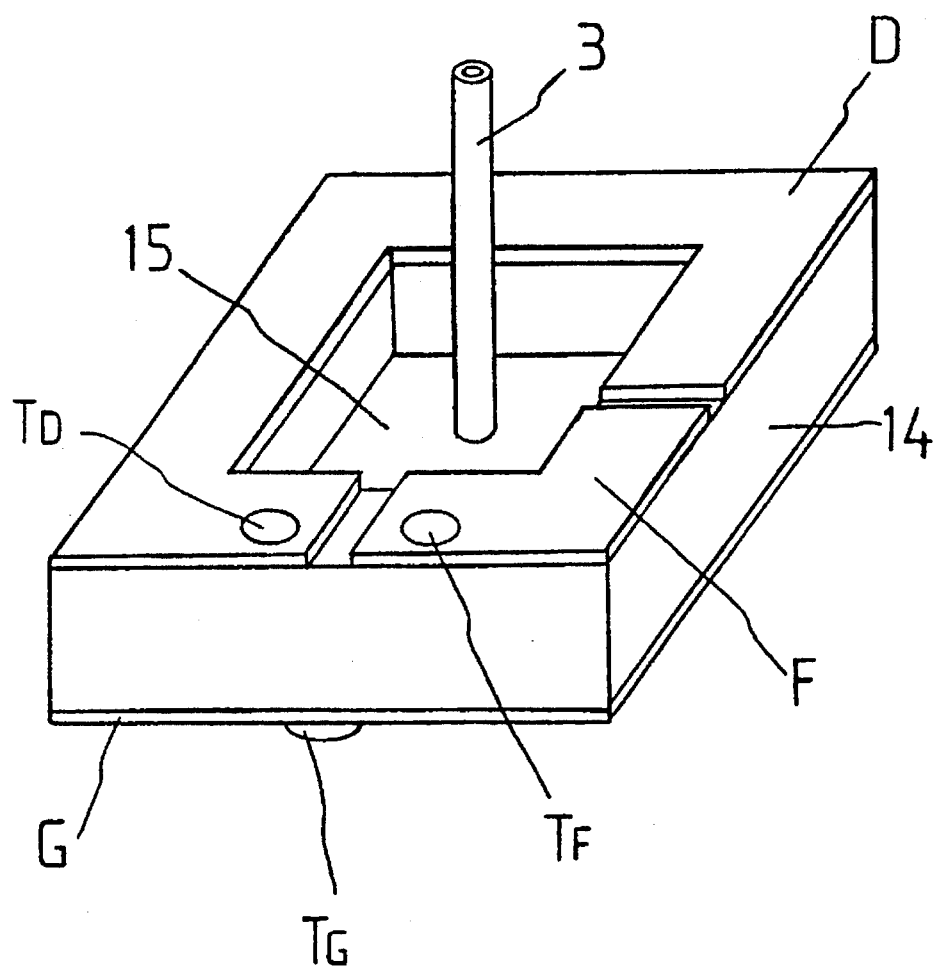
FIG. 17 shows a perspective view of an ultrasonic vibrating unit according to a third embodiment of the present invention.

FIG. 17 shows a perspective view of an ultrasonic vibrating unit according to a third embodiment of the present invention. The ultrasonic vibrating unit comprises a piezoelectric vibrator 14, a vibrating plate 15, the bar 3, the self-oscillator circuit 9, electrodes D and F, formed on one end surface of the piezoelectric vibrator 14 with electrically separated condition each other, an electrode G formed on the other end surface of the piezoelectric vibrator 14, electrode terminals $T_D$, $T_F$ and $T_G$, formed on the electrodes D, F and G, respectively. The electrodes D, F and G, are made from aluminium thin film. The electrode terminals $T_D$, $T_F$ and $T_G$, are made from copper ribbon and cemented on the electrodes D, F and G, respectively, by an adhesive agent which is of high conductivity. The self-oscillator circuit 9 is not drawn in FIG. 17. The piezoelectric vibrator 14 made of a TDK-91A piezoelectric ceramic (TDK Company) providing a high electromechanical coupling constant has a rectangular pillar-shaped body, with dimensions of 14 mm in length, 14 mm in width and 4 mm in thickness, and having a rectangular pillar-shaped pierced hole therein parallel to the thickness direction thereof and with dimensions of 8 mm in length, 8 mm in width and 4 mm in thickness. The direction of the polarization axis of the piezoelectric vibrator 14 is parallel to the thickness direction thereof. The vibrating plate 15 made of stainless steel having a plate-like body has a first surface portion and a second surface portion on one end surface thereof, the first surface portion being cemented to the piezoelectric vibrator 14 with an electroconductive epoxy resin (Dotite, Fujikura Chemical) and in contact with the electrode G such that the vibrating plate 15 is mounted at a position which covers the opening of the pierced hole of the piezoelectric vibrator 14, the second surface portion being surrounded by the first surface portion. The dimensions of the vibrating plate 15 are 10 mm in length, 10 mm in width and 0.05 mm in thickness. The piezoelectric vibrator 14, the vibrating plate 15 and the bar 3 form a vibrating assembly.

The ultrasonic vibrating unit shown in FIG. 17 is operated as the ultrasonic vibrating unit shown in FIG. 9. When operating the ultrasonic vibrating unit shown in FIG. 17, the best self-oscillation is realized in case that the electrode D has the same area on the one end surface of piezoelectric vibrator 14 as electrode F, or the area not only more than the same as the electrode F but also less than five times the electrode F. The piezoelectric vibrator 14 has a pillar-shaped body with a pierced hole located parallel to the thickness direction of the piezoelectric vibrator 14, the ratio of the dimension in thickness to the shortest distance between the outer edge and the inner edge of an end surface of the piezoelectric vibrator 14 being approximately equal to 1. Therefore, a coupled-mode vibration of the vibrating assembly is strengthened. Thus, acoustic vibration can be transmitted to all the bar 3 over. The vibrating plate 15 is fixed to be integrally interlocked with the piezoelectric vibrator 14 by the first surface portion of the vibrating plate 15, almost parallel to the end surfaces of the piezoelectric vibrator 14, on the position which covers the opening of the pierced hole of the piezoelectric vibrator 14. Therefore, the vibrating plate 15 can be made to vibrate effectively. Accordingly, the acoustic vibration can be transmitted to all the bar 3 fixed to be interlocked with the vibrating plate 15 effectively.

Another embodiment of an ultrasonic vibrating actuator according to the present invention is provided, the ultrasonic vibrating actuator containing the ultrasonic vibrating unit, shown in FIG. 17, and the rotor 4. The pendulum 5 or the dish 6 is also available in the ultrasonic vibrating actuator. The rotor 4, the pendulum 5 or the dish 6, which can be made to move in the same way as in FIG. 4, is operated under a lower voltage with lower power consumption than in FIG. 4. Besides, the ultrasonic vibrating actuator has stable output characteristics over a long time. While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. An ultrasonic vibrating unit comprising:

a piezoelectric vibrator having two end surfaces running perpendicular to the thickness direction of said piezoelectric vibrator;

a pair of electrodes D and G, formed on said two end surfaces, respectively;

electrode terminals $T_D$ and $T_G$, formed on said electrodes D and G, respectively;

a vibrating plate connected to said electrode D or G; and at least one bar fixed to said vibrating plate such that one tip of said bar is in contact with one end surface of said vibrating plate or penetrates from one end surface to the other end surface thereof, said piezoelectric vibrator, said vibrating plate and said bar forming a vibrating assembly, said piezoelectric vibrator having a pillar-shaped body with a pierced hole located parallel to the thickness direction of said piezoelectric vibrator, the ratio of length in the thickness direction of said piezoelectric vibrator to the shortest distance between the outer edge and the inner edge of an end surface of said piezoelectric vibrator being approximately equal to 1, said vibrating plate covering an opening of said pierced hole, said electrode terminals $T_D$ and $T_G$ receiving an electric signal with a frequency approximately equal to a resonance frequency of said piezoelectric vibrator and causing said piezoelectric vibrator to vibrate acoustically, said piezoelectric vibrator transmitting the acoustic vibration to said vibrating plate, said vibrating plate transmitting said acoustic vibration to said bar and causing an acoustic vibrating condition on surface of said bar.

2. An ultrasonic vibrating unit as defined in claim 1, wherein said piezoelectric vibrator has a rectangular pillar-shaped body with a rectangular pillar-shaped pierced hole therein.

3. An ultrasonic vibrating unit as defined in claim 1, wherein said piezoelectric vibrator has a cylindrical-shaped body with a cylindrical-shaped pierced hole therein.

4. An ultrasonic vibrating unit as defined in claim 1, wherein said bar has a tubular or non-tubular structure, and has a branched or non-branched structure.

5. An ultrasonic vibrating unit comprising:

a piezoelectric vibrator having two end surfaces running perpendicular to the thickness direction of said piezoelectric vibrator;

at least two electrodes D and F, formed on one end surface of said piezoelectric vibrator with electrically separated condition each other;

at least one electrode G formed on the other end surface of said piezoelectric vibrator;

electrode terminals $T_D$, $T_F$ and $T_G$, formed on said electrodes D, F and G, respectively;

a vibrating plate connected to said electrode G; and at least one bar fixed to said vibrating plate such that one tip of said bar is in contact with one end surface of said vibrating plate or penetrates from one end surface to the other end surface thereof, said piezoelectric vibrator, said vibrating plate and said bar forming a vibrating assembly, said piezoelectric vibrator having a pillar-shaped body with a pierced hole located parallel to the thickness direction of said piezoelectric vibrator, the ratio of length in the thickness direction of said piezoelectric vibrator to the shortest distance between the outer edge and the inner edge of an end surface of said piezoelectric vibrator being approximately equal to 1, said vibrating plate covering an opening of said pierced hole, said electrode terminals $T_D$ and $T_G$ receiving an electric signal with a frequency approximately equal to a resonance frequency of said piezoelectric vibrator and causing said piezoelectric vibrator to vibrate acoustically, said piezoelectric vibrator not only transmitting the acoustic vibration to said vibrating plate, but also transducing said acoustic vibration, between said electrode terminals $T_F$ and $T_G$, to an electric signal with a frequency approximately equal to a resonance frequency of said vibrating assembly, said vibrating plate transmitting said acoustic vibration to said bar and causing an acoustic vibrating condition on surface of said bar, said electrode terminals $T_F$ and $T_G$ delivering said electric signal transduced from said acoustic vibration.

6. An ultrasonic vibrating unit as defined in claim 5, wherein said electrode D has approximately the same area on said one end surface of said piezoelectric vibrator as said electrode F, or the area not only more than the same as electrode F but also less than five times electrode F.

7. An ultrasonic vibrating unit as defined in claim 5 further comprising:

a self-oscillator circuit containing
a coil $L_1$ connected between a direct current power supply $V_{dc}$ and said electrode terminal $T_D$, and
a transistor $T_{r1}$, output terminal thereof being connected to said electrode terminal $T_D$ and input terminal thereof being connected to said electrode terminal $T_F$,
said piezoelectric vibrator acting as a resonance element and said transistor $T_{r1}$ acting as a feedback amplifier element.

8. An ultrasonic vibrating unit as defined in claim 5 further comprising:

a self-oscillator circuit consisting of
a current sensing circuit for detecting the phase of a current in said piezoelectric vibrator, said current sensing circuit containing two diodes $D_1$ and $D_2$, said diode $D_1$ being connected in series to said piezoelectric vibrator, said diode $D_2$ being connected in parallel to said diode $D_1$,
a voltage amplifying circuit for amplifying a low voltage signal detected in said current sensing circuit, and
a power amplifying circuit containing a transistor $T_{r1}$ and a coil $L_1$ for supplying said piezoelectric vibrator with an electric power,
said piezoelectric vibrator acting as a resonance element and said transistor $T_{r1}$ acting as a feedback amplifier element.

9. An ultrasonic vibrating unit as defined in claim 5, wherein said piezoelectric vibrator has a rectangular pillar-shaped body with a rectangular pillar-shaped pierced hole therein.

10. An ultrasonic vibrating unit as defined in claim 5, wherein said piezoelectric vibrator has a cylindrical-shaped body with a cylindrical-shaped pierced hole therein.

11. An ultrasonic vibrating unit as defined in claim 5, wherein said bar has a tubular or non-tubular structure, and has a branched or non-branched structure.

12. An ultrasonic vibrating actuator comprising:

a piezoelectric vibrator having two end surfaces running perpendicular to the thickness direction of said piezoelectric vibrator;

a pair of electrodes D and G, formed on said two end surfaces, respectively;

electrode terminals $T_D$ and $T_G$, formed on said electrodes D and G, respectively;

a vibrating plate connected to said electrode D or G;

at least one bar fixed to said vibrating plate such that one tip of said bar is in contact with one end surface of said vibrating plate or penetrates from one end surface to the other end surface thereof; and at least one moving element being in contact with surface of said bar, said piezoelectric vibrator, said vibrating plate and said bar forming a vibrating assembly, said piezoelectric vibrator having a pillar-shaped body with a pierced hole located parallel to the thickness direction of said piezoelectric vibrator, the ratio of length in the thickness direction of said piezoelectric vibrator to the shortest distance between the outer edge and the inner edge of an end surface of said piezoelectric vibrator being approximately equal to 1, said vibrating plate covering an opening of said pierced hole, said electrode terminals $T_D$ and $T_G$ receiving an electric signal with a frequency approximately equal to a resonance frequency of said piezoelectric vibrator and causing said piezoelectric vibrator to vibrate acoustically, said piezoelectric vibrator transmitting the acoustic vibration to said vibrating plate, said vibrating plate transmitting said acoustic vibration to said bar and causing an acoustic vibrating condition on said surface of said bar, said bar moving said moving element by acoustic displacement.

13. An ultrasonic vibrating actuator as defined in claim 12, wherein said piezoelectric vibrator has a rectangular pillar-shaped body with a rectangular pillar-shaped pierced hole therein.

14. An ultrasonic vibrating actuator as defined in claim 12, wherein said piezoelectric vibrator has a cylindrical-shaped body with a cylindrical-shaped pierced hole therein.

15. An ultrasonic vibrating actuator as defined in claim 12, wherein said bar has a tubular or non-tubular structure, and has a branched or non-branched structure.

16. An ultrasonic vibrating actuator as defined in claim 12, wherein said moving element being in contact with one tip of said bar is rotated on said tip of said bar round the rotation axis parallel to the longitudinal direction of said bar.

17. An ultrasonic vibrating actuator as defined in claim 12, wherein said moving element being in contact with side of said bar is moved or pendulated along the longitudinal direction of said bar.

18. An ultrasonic vibrating actuator comprising:

a piezoelectric vibrator having two end surfaces running perpendicular to the thickness direction of said piezoelectric vibrator;

at least two electrodes D and F, formed on one end surface of said piezoelectric vibrator with electrically separated condition each other;

at least one electrode G formed on the other end surface of said piezoelectric vibrator;

electrode terminals $T_D$, $T_F$ and $T_G$, formed on said electrodes D, F and G, respectively;

a vibrating plate connected to said electrode G;

at least one bar fixed to said vibrating plate such that one tip of said bar is in contact with one end surface of said vibrating plate or penetrates from one end surface to the other end surface thereof; and at least one moving element being in contact with surface of said bar, said piezoelectric vibrator, said vibrating plate and said bar forming a vibrating assembly, said piezoelectric vibrator having a pillar-shaped body with a pierced hole located parallel to the thickness direction of said piezoelectric vibrator, the ratio of length in the thickness direction of said piezoelectric vibrator to the shortest distance between the outer edge and the inner edge of an end surface of said piezoelectric vibrator being approximately equal to 1, said vibrating plate covering an opening of said pierced hole, said electrode terminals $T_D$ and $T_G$ receiving an electric signal with a frequency approximately equal to a resonance frequency of said piezoelectric vibrator and causing said piezoelectric vibrator to vibrate acoustically, said piezoelectric vibrator not only transmitting the acoustic vibration to said vibrating plate, but also transducing said acoustic vibration, between said electrode terminals $T_F$ and $T_G$, to an electric signal with a frequency approximately equal to a resonance frequency of said vibrating assembly, said vibrating plate transmitting said acoustic vibration to said bar and causing an acoustic vibrating condition on surface of said bar, said bar moving said moving element by acoustic displacement, said electrode terminals $T_F$ and $T_G$ delivering said electric signal transduced from said acoustic vibration.

19. An ultrasonic vibrating actuator as defined in claim 18, wherein said electrode D has approximately the same area on said one end surface of said piezoelectric vibrator as said electrode F, or the area not only more than the same as electrode F but also less than five times electrode F.

20. An ultrasonic vibrating actuator as defined in claim 18 further comprising:

a self-oscillator circuit containing
a coil $L_1$ connected between a direct current power supply $V_{dc}$ and said electrode terminal $T_D$, and
a transistor $T_{r1}$, output terminal thereof being connected to said electrode terminal $T_D$ and input terminal thereof being connected to said electrode terminal $T_F$,
said piezoelectric vibrator acting as a resonance element and said transistor $T_{r1}$ acting as a feedback amplifier element.

21. An ultrasonic vibrating actuator as defined in claim 18 further comprising:

a self-oscillator circuit consisting of
a current sensing circuit for detecting the phase of a current in said piezoelectric vibrator, said current sensing circuit containing two diodes $D_1$ and $D_2$, said diode $D_1$ being connected in series to said piezoelectric vibrator, said diode $D_2$ being connected in parallel to said diode $D_1$,
a voltage amplifying circuit for amplifying a low voltage signal detected in said current sensing circuit, and
a power amplifying circuit containing a transistor $T_{r1}$ and a coil $L_1$ for supplying said piezoelectric vibrator with an electric power,
said piezoelectric vibrator acting as a resonance element and said transistor $T_{r1}$ acting as a feedback amplifier element.

22. An ultrasonic vibrating actuator as defined in claim 18, wherein said piezoelectric vibrator has a rectangular pillar-shaped body with a rectangular pillar-shaped pierced hole therein.

23. An ultrasonic vibrating actuator as defined in claim 18, wherein said piezoelectric vibrator has a cylindrical-shaped body with a cylindrical-shaped pierced hole therein.

24. An ultrasonic vibrating actuator as defined in claim 18, wherein said bar has a tubular or non-tubular structure, and has a branched or non-branched structure.

25. An ultrasonic vibrating actuator as defined in claim 18, wherein said moving element being in contact with one tip of said bar is rotated on said tip of said bar round the rotation axis parallel to the longitudinal direction of said bar.

26. An ultrasonic vibrating actuator as defined in claim 18, wherein said moving element being in contact with side of said bar is moved or pendulated along the longitudinal direction of said bar.

* * * * *